(12) United States Patent
Nguyen et al.

(10) Patent No.: US 8,455,938 B2
(45) Date of Patent: Jun. 4, 2013

(54) DEVICE COMPRISING A FIELD-EFFECT TRANSISTOR IN A SILICON-ON-INSULATOR

(75) Inventors: Bich-Yen Nguyen, Austin, TX (US);
Carlos Mazure, Bernin (FR); Richard Ferrant, Esquibien (FR)

(73) Assignee: Soitec, Bernin (FR)

( * ) Notice: Subject to any disclaimer, the term of this patent is extended or adjusted under 35 U.S.C. 154(b) by 369 days.

(21) Appl. No.: 12/886,421

(22) Filed: Sep. 20, 2010

(65) Prior Publication Data
US 2011/0260233 A1    Oct. 27, 2011

(30) Foreign Application Priority Data

Apr. 22, 2010   (EP) .................................... 10290217

(51) Int. Cl.
*H01L 29/788*   (2006.01)
*H01L 27/12*    (2006.01)

(52) U.S. Cl.
USPC ..................... 257/316; 257/347; 257/E29.265

(58) Field of Classification Search
USPC .......................................... 257/347, E29.265
See application file for complete search history.

(56) References Cited

U.S. PATENT DOCUMENTS

| | | | |
|---|---|---|---|
| 4,169,233 A | 9/1979 | Haraszti | 307/355 |
| 5,028,810 A | 7/1991 | Castro et al. | 307/201 |
| 5,306,530 A | 4/1994 | Strongin et al. | 427/533 |
| 5,325,054 A | 6/1994 | Houston | 324/158 |
| 5,455,791 A | 10/1995 | Zaleski et al. | 365/185.26 |
| 5,557,231 A | 9/1996 | Yamaguchi et al. | 327/534 |
| 5,608,223 A | 3/1997 | Hirokawa et al. | 250/447.11 |
| 5,646,900 A | 7/1997 | Tsukude et al. | 365/205 |
| 5,753,923 A | 5/1998 | Mera et al. | 250/443.1 |
| 5,844,845 A | 12/1998 | Tahara | 365/189.05 |

(Continued)

FOREIGN PATENT DOCUMENTS

| EP | 1 081 748 A2 | 3/2001 |
|---|---|---|
| EP | 1 095 407 A1 | 5/2001 |

(Continued)

OTHER PUBLICATIONS

Topol et al., "Enabling SOI-Based Assembly Technology for Three-Dimensional (3D) Integrated Circuits (ICs)," IEEE International, Electron Devices Meeting, IDEM Technical Digest published Dec. 5, 2005.

(Continued)

*Primary Examiner* — Lex Malsawma
(74) *Attorney, Agent, or Firm* — Winston & Strawn LLP

(57) ABSTRACT

The present invention relates to a semiconductor device that has a semiconductor-on-insulator (SeOI) structure, which includes a substrate, an insulating layer such as an oxide layer on the substrate and a semiconductor layer on the insulating layer with a field-effect-transistor (FET) formed in the SeOI structure from the substrate and deposited layers, wherein the FET has a channel region in the substrate, a gate dielectric layer that is made from at least a part of the oxide layer of the SeOI structure; and a gate electrode that is formed at least partially from a part of the semiconductor layer of the SeOI structure. The invention further relates to a method of forming one or more field-effect-transistors or metal-oxide-semiconductor transistors from a semiconductor-on-insulator structure that involves patterning and etching the SeOI structure, forming shallow trench isolations, depositing insulating, metal or semiconductor layers, and removing mask and/or pattern layers.

20 Claims, 12 Drawing Sheets

U.S. PATENT DOCUMENTS

| | | | |
|---|---|---|---|
| 5,869,872 A * | 2/1999 | Asai et al. | 257/360 |
| 5,889,293 A | 3/1999 | Rutten et al. | 257/74 |
| 6,043,536 A | 3/2000 | Numata et al. | 257/347 |
| 6,063,686 A | 5/2000 | Masuda et al. | 438/406 |
| 6,072,217 A | 6/2000 | Burr | 257/351 |
| 6,108,264 A | 8/2000 | Takahashi et al. | 365/230.03 |
| 6,141,269 A | 10/2000 | Shiomi et al. | 365/200 |
| 6,300,218 B1 | 10/2001 | Cohen et al. | 438/423 |
| 6,372,600 B1 | 4/2002 | Desko et al. | 438/406 |
| 6,476,462 B2 | 11/2002 | Shimizu et al. | 257/627 |
| 6,498,057 B1 | 12/2002 | Christensen et al. | 438/149 |
| 6,611,023 B1 | 8/2003 | En et al. | 257/350 |
| 6,825,524 B1 | 11/2004 | Ikehashi et al. | 257/314 |
| 7,109,532 B1 | 9/2006 | Lee et al. | 257/133 |
| 7,112,997 B1 | 9/2006 | Liang et al. | 326/81 |
| 7,447,104 B2 | 11/2008 | Leung | 365/230.06 |
| 7,449,922 B1 | 11/2008 | Ricavy | 327/57 |
| 2001/0038299 A1 | 11/2001 | Afghahi et al. | 326/86 |
| 2001/0047506 A1 | 11/2001 | Houston | 716/4 |
| 2002/0105277 A1 | 8/2002 | Tomita et al. | 315/111.81 |
| 2002/0114191 A1 | 8/2002 | Iwata et al. | 365/185.23 |
| 2002/0185684 A1 | 12/2002 | Campbell et al. | 257/347 |
| 2003/0001658 A1 | 1/2003 | Matsumoto | 327/534 |
| 2004/0070031 A1 * | 4/2004 | Baba | 257/347 |
| 2004/0108532 A1 | 6/2004 | Forbes | 257/296 |
| 2004/0146701 A1 | 7/2004 | Taguchi | 428/209 |
| 2004/0197970 A1 | 10/2004 | Komatsu | 438/163 |
| 2005/0077566 A1 | 4/2005 | Zheng et al. | 257/315 |
| 2005/0110078 A1 | 5/2005 | Shino | 257/331 |
| 2005/0255666 A1 | 11/2005 | Yang | 438/401 |
| 2005/0276094 A1 | 12/2005 | Yamaoka et al. | 365/154 |
| 2006/0013028 A1 | 1/2006 | Sarin et al. | 365/49 |
| 2006/0013042 A1 | 1/2006 | Forbes et al. | 365/185.08 |
| 2006/0035450 A1 | 2/2006 | Frank et al. | 438/585 |
| 2006/0220085 A1 | 10/2006 | Huo et al. | 257/296 |
| 2006/0226463 A1 | 10/2006 | Forbes | 257/301 |
| 2006/0267064 A1 | 11/2006 | Rosner et al. | 257/304 |
| 2006/0291321 A1 | 12/2006 | Leung | 365/230.06 |
| 2007/0029596 A1 | 2/2007 | Hazama | 257/296 |
| 2007/0029620 A1 | 2/2007 | Nowak | 257/369 |
| 2007/0063284 A1 | 3/2007 | Kawahara et al. | 257/351 |
| 2007/0075366 A1 | 4/2007 | Hamamoto | 257/347 |
| 2007/0076467 A1 | 4/2007 | Yamaoka et al. | 365/154 |
| 2007/0139072 A1 | 6/2007 | Yamaoka et al. | 326/33 |
| 2007/0152736 A1 | 7/2007 | Itoh et al. | 327/534 |
| 2007/0158583 A1 | 7/2007 | Cho | 250/440.11 |
| 2007/0171748 A1 | 7/2007 | Mukhopadhyay et al. | 365/208 |
| 2007/0241388 A1 | 10/2007 | Yamamoto et al. | 257/314 |
| 2007/0298549 A1 | 12/2007 | Jurczak et al. | 438/152 |
| 2008/0042187 A1 | 2/2008 | Hwang | 257/316 |
| 2008/0111199 A1 | 5/2008 | Kim et al. | 257/401 |
| 2008/0116939 A1 | 5/2008 | Takizawa | 326/103 |
| 2008/0144365 A1 | 6/2008 | Yamaoka et al. | 365/181 |
| 2008/0173916 A1 | 7/2008 | Nishihara | 257/298 |
| 2008/0203403 A1 | 8/2008 | Kawahara et al. | 257/80 |
| 2008/0251848 A1 | 10/2008 | Borot et al. | 257/365 |
| 2008/0253159 A1 | 10/2008 | Kajigaya | 365/51 |
| 2008/0283918 A1 * | 11/2008 | Cheng et al. | 257/347 |
| 2009/0003105 A1 | 1/2009 | Itoh et al. | 365/203 |
| 2009/0010056 A1 * | 1/2009 | Kuo et al. | 365/184 |
| 2009/0086535 A1 | 4/2009 | Ferrant et al. | 365/174 |
| 2009/0096011 A1 | 4/2009 | Hong et al. | 257/321 |
| 2009/0096936 A1 | 4/2009 | Hamada et al. | 257/392 |
| 2009/0101940 A1 | 4/2009 | Barrows et al. | 257/204 |
| 2009/0111223 A1 | 4/2009 | Wiatr et al. | 438/155 |
| 2009/0121269 A1 | 5/2009 | Caillat et al. | 257/301 |
| 2009/0200605 A1 * | 8/2009 | Bjoerk et al. | 257/330 |
| 2009/0310431 A1 | 12/2009 | Saito | 365/207 |
| 2010/0032761 A1 | 2/2010 | Ding et al. | 257/350 |
| 2010/0035390 A1 * | 2/2010 | Ding et al. | 438/152 |
| 2010/0079169 A1 | 4/2010 | Kim et al. | 326/120 |
| 2010/0117684 A1 | 5/2010 | Kim et al. | 326/120 |
| 2011/0133280 A1 * | 6/2011 | Bangsaruntip et al. | 257/347 |

FOREIGN PATENT DOCUMENTS

| | | |
|---|---|---|
| EP | 1 199 745 A2 | 4/2002 |
| EP | 1 233 454 A2 | 8/2002 |
| EP | 1 357 603 A2 | 10/2003 |
| EP | 1 744 364 A2 | 1/2007 |
| FR | 2 925 223 | 6/2009 |
| JP | 04345064 A | 12/1992 |
| JP | 08255846 | 10/1996 |
| JP | 09232446 | 9/1997 |
| JP | 10125064 A | 5/1998 |
| JP | 2000196089 A | 7/2000 |
| JP | 2004303499 | 10/2004 |
| WO | WO 99/66559 | 12/1999 |
| WO | WO 2007/060145 A1 | 5/2007 |
| WO | WO 2008/134688 A1 | 11/2008 |
| WO | WO 2009/013422 A2 | 1/2009 |
| WO | WO 2009/028065 A1 | 3/2009 |
| WO | WO 2009/077538 A2 | 6/2009 |
| WO | WO 2009/085865 A1 | 7/2009 |
| WO | WO 2009/104060 A1 | 8/2009 |
| WO | WO 2010/007478 A1 | 1/2010 |

OTHER PUBLICATIONS

European Search Report Application No. EP 10 29 0217 dated Sep. 15, 2010.
U.S. Appl. No. 12/886,421, filed Sep. 20, 2010.
U.S. Appl. No. 12/961,293, filed Dec. 6, 2010.
U.S. Appl. No. 12/942,754, filed Nov. 9, 2010.
U.S. Appl. No. 12/984,466, filed Jan. 4, 2011.
European Search Report Application No. EP 10290181.6 dated Jan. 14, 2011.
U.S. Appl. No. 13/007,483, filed Jan. 14, 2011.
U.S. Appl. No. 13/013,580, filed Jan. 25, 2011.
U.S. Appl. No. 12/880,806, filed Sep. 13, 2010.
U.S. Appl. No. 12/898,230, filed Oct. 5, 2010.
U.S. Appl. No. 12/946,135, filed Nov. 15, 2010.
U.S. Appl. No. 12/974,916, filed Dec. 21, 2010.
U.S. Appl. No. 12/974,822, filed Dec. 21, 2010.
U.S. Appl. No. 13/039,167, filed Mar. 2, 2011.
European Search Report Application No. EP 09290838.3 dated Feb. 16, 2010.
D.E. Ioannou, et al. "Opposite-Channel-Based Injection of Hot-Carriers in SOI MOSFET's: Physics and Applications" IEEE Transactions on Electron Devices, vol. 45, No. 5, pp. 1147-1154 (1998).
M. Yamaoka, et al., "Dynamic-Vt Dual-Power-Supply SRAM Cell using D2G-SOI for Low-Power SoC Application," IEEE International SOI conference, Oct. 2004, pp. 109-111 (2004).
Ulicki, Bob et al., "De-Myth-tifying" the SOI Floating Body Effect, SOI Industry Consortium, pp. 2-7 (2009).
I. Hassoune et al. "Double-gate MOSFET Based Reconfigurable Cells", The Institution of Engineering and Technology, Electronics Letters, vol. 43, No. 23, 3 pages (2007).
P.J. Klim et al, "A 1 MB Cache Subsystem Prototype With 1.8 ns Embedded DRAMs in 45 nm SOI CMOS", IEEE, Journal of Solid-State Circuits, vol. 44, No. 4, pp. 1216-1226 (2009).
John Barth et al., "A 500MHz Random Cycle 1.5ns-Latency, SOI Embedded DRAM Macro Featuring a 3T Micro Sense Amplifier", ISSCC 2007/Session 27/DRAM and eRAM /27.1, IEEE International Solid-State Circuits Conference, Digest of Technical Papers, pp. 486-487 and p. 617 (2007).
John Barth et al., "A 45nm SOI Embedded DRAM Macro for POWER7™ 32MB On-Chip L3 Cache", ISSCC 2010/Session 19/High-Performance Embedded Memory/19.1, IEEE International Solid-State Circuits Conference, Digest of Technical Papers, pp. 342-344 (2010).
Paul Beckett, XP-002579039, "Performance Characteristics of a Nanoscale Double-gate Reconfigurable Array", Proc. Of SPIE, vol. 7268, pp. 72680E-1-72680E-12 (2008).
K. Cheng, et al., "Extremely Thin SOI (ETSOI) CMOS with Record Low Variability for Low Power System-on-Chip Applications", IBM Research at Albany Nanotech, pp. 3.2.1-3.2.4( 2009).
K. J. Kuhn, "Variation in 45nm and Implications for 32nm and Beyond", Intel, 2009 $2^{nd}$ International CMOS Variability Conference—London, pp. 1-86.
Choi Hoon, et al., XP-002579041, Improved Current Drivability With Back-Gate Bias for Elevated Source and Drain Structured FD-SOI SiGe MOSFET, Microelectronic Engineering, vol. 86, pp. 2165-2169 (2009).

E.I. Dimitris, et al. "Opposite-Channel-Based Injection of Hot-Carriers in SOI MOSFET's: Physics and Applications" IEEE Transactions on Electron Devices, vol. 45, No. 5, pp. 1147-1154 (1998).

M. Mizukami, et al., "Depletion-type Cell-Transistor of 23 nm Cell Size on Partial SOI Substrate for NAND Flash Memory," Extended Abstracts of the 2009 International Conference on Solid State Devices and Materials, Sendai, pp. 865-866 (2009).

M. Matsumiya, et al., "A 15-ns 16-Mb CMOS SRAM With Interdigitated Bit-Line Architecture," IEEE Journal of Solid-State Circuits, vol. 27, No. 11, pp. 1497-1503 (1992).

S. Mukhopadhyay, et al., "A Novel High-Performance and Robust Sense Amplifier Using Independent Gate Control in Sub-50-nm Double-Gate MOSFET," IEEE Transactions on Very Large Scale Integration (VLSI) Systems, vol. 14, No. 2, pp. 183-192 (2006).

S. Mukhopadhyay, et al., "Design of High Performance Sense Amplifier Using Independent Gate Control in Sub-50nm Double-Gate MOSFET," Computer Society, Proceedings of the Sixth International Symposium on Quality Electronic Design (ISQED'05), The British Library, IEEE Xplore, 6 pages, (2010).

P. Nasalski, et al. "An Innovative sub-32nm SRAM Voltage Sense Amplifier in Double-Gate CMOS Insensitive to Process Variations and Transistor Mismatch" The 15$^{th}$ IEEE International Conference on Electronics, Circuits and Systems, pp. 554-557, (ICECS 2008).

P. Nasalski, et al. "SRAM Voltage and Current Sense Amplifiers in sub-32nm Double-Gate CMOS Insensitive to Process Variations and Transistor Mismatch" IEEE, The British Library, IEEE Xplore, pp. 3170-3173 (2009).

T. Ohtou, et al. "Threshold-Voltage Control of AC Performance Degradation-Free FD SOI MOSFET With Extremely Thin BOX Using Variable Body-Factor Scheme", IEEE Transactions on Electron Devices, vol. 54, No. 2, pp. 301-307, ( 2007).

K. Roy et al., "Double-Gate SOI Devices for Low-Power and High-Performance Applications," IEEE Computer Society, The British Library, IEEE Xplore, 8 pages, (2006).

R. Tsuchiya, et al., "Silicon on Thin BOX: A New Paradigm of the CMOSFET for Low-Power and High-Performance Application Featuring Wide-Range Back-Bias Control" 2004 IEEE, 4 pages.

R.Tsuchiya et al. Controllable Inverter Delay and Suppressing $V_{th}$ Fluctuation Technology in Silicon on Thin BOX Featuring Dual Back-Gate Bias Architecture, Central Research Laboratory, Tokyo, Japan, IEEE, pp. 475-478 (2007).

Wilhelmus A. M. Van Noije, et al., XP-002579040, "Advanced CMOS Gate Array Architecture Combining "Gate Isolation" and Programmable Routing Channels," IEEE Journal of Solid-State Circuits, Special Papers, vol. SC-20, No. 2, pp. 469-480 (1985).

M. Yamaoka, et al., "SRAM Circuit With Expanded Operating Margin and Reduced Stand-By Leakage Current Using Thin-BOX FD-SOI Transistors," IEEE Journal of Solid-State Circuits, vol. 41, No. 11, pp. 2366-2372 (2006).

U.S. Appl. No. 12/793,553, filed Jun. 3, 2010.
U.S. Appl. No. 12/789,100, filed May 27, 2010.
U.S. Appl. No. 12/793,515, filed Jun. 3, 2010.

* cited by examiner

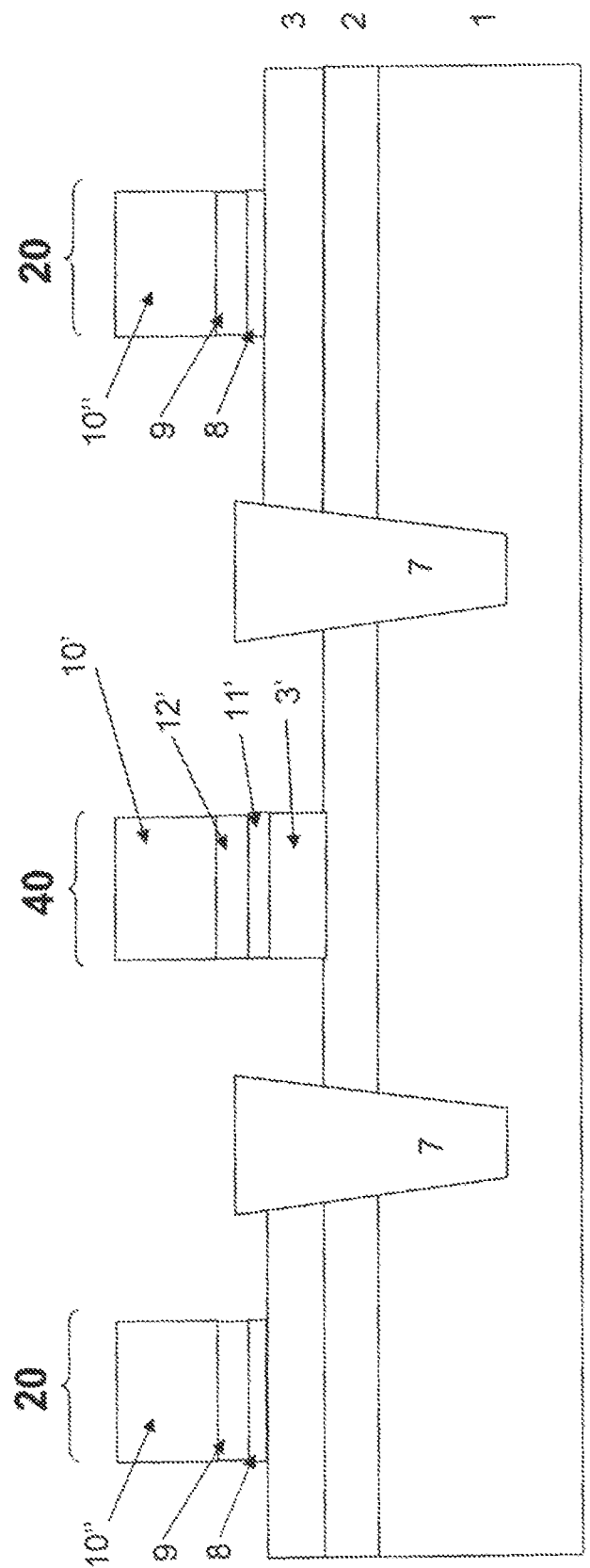

DEVICE COMPRISING A FIELD-EFFECT TRANSISTOR IN A SILICON-ON-INSULATOR

FIELD OF THE INVENTION

The present invention relates to the manufacture of a field-effect transistor in a silicon-on-insulator structure and, in particular, to a system-on-chip comprising densely packed field-effect transistors that may share functional regions.

BACKGROUND

Semiconductor-On-Insulator (SeOI) and, in particular, Silicon-On-Insulator (SOI) semiconductor devices are of increasing interest in present and future semiconductor manufacturing, for example, in the context of the Complementary Metal Oxide Semiconductor (CMOS) technology. In modern integrated circuits, a very high number of individual circuit elements, such as field effect transistors (FET) in the form of CMOS, NMOS, PMOS elements, resistors, capacitors, and the like are formed on a single chip area. Typically, feature sizes of these circuit elements are steadily decreasing with the introduction of every new circuit generation, to provide currently available integrated circuits with an improved degree of performance in terms of speed and/or power consumption. A reduction in size of transistors is an important aspect in steadily improving device performance of complex integrated circuits, such as CPUs. The reduction in size commonly brings about an increased switching speed, thereby enhancing signal processing performance.

During the fabrication of complex integrated circuits using CMOS technology, millions of transistors, i.e., n-channel transistors and p-channel transistors, are formed on a substrate including a crystalline semiconductor layer. Transistor elements are the dominant circuit element in highly complex integrated circuits which substantially determine the overall performance of these devices.

A metal-oxide-semiconductor (MOS) transistor, irrespective of whether an n-channel transistor or a p-channel transistor is considered, comprises so-called pn-junctions that are formed by an interface of highly doped drain and source regions with an inversely or weakly doped channel region disposed between the drain region and the source region. The conductivity of the channel region, i.e., the drive current capability of the conductive channel, is controlled by a gate electrode formed near the channel region and separated therefrom by a thin insulating layer. The conductivity of the channel region upon formation of a conductive channel due to the application of an appropriate control voltage to the gate electrode, depends on the dopant concentration, the mobility of the majority charge carriers, and—for a given extension of the channel region in the transistor width direction—on the distance between the source and drain regions, which is also referred to as channel length.

Due to the decreased dimensions of circuit elements, not only the performance of the individual transistor elements may be increased, but also their packing density may be improved, thereby providing the potential for incorporating increased functionality into a given chip area. For this reason, highly complex circuits have been developed, which may include different types of circuits, such as analogue circuits, digital circuits and the like, thereby providing entire systems on a single chip (SoC).

The continuing shrinkage of the transistor dimensions, however, involves a plurality of issues associated therewith that have to be addressed so as to not unduly offset the advantages obtained by steadily decreasing the channel length of MOS transistors. One major problem in this respect is to provide for low sheet and contact resistivity in drain and source regions and any contacts connected thereto and to maintain channel controllability. For example, reducing the channel length may necessitate an increase of the capacitive coupling between the gate electrode and the channel region, which may call for reduced thickness of the gate insulation layer. Presently, the thickness of silicon dioxide based gate insulation layers is in the range of 1 to 2 nanometers, wherein a further reduction may be less desirable in view of leakage currents which typically exponentially increase when reducing the gate dielectric thickness.

However, the interface of the gate dielectric and polysilicon that is conventionally used for the manufacture of the gate electrode is characterized by grain boundaries affecting a uniform dopant profile and resulting in poor adhesion properties and reliability failures. Moreover, given the continually decreased dimensions of circuit elements and despite the recent engineering progress, there is still a need for more compact configurations of transistor elements of different performance properties.

SUMMARY OF THE INVENTION

In view of the above, the present invention relates to the methods for the manufacture of semiconductor devices and the semiconductor devices in which transistors may be formed in a space efficient manner having improved properties with respect to the gate dielectric—gate electrode interface.

A preferred embodiment of the present invention relates to a semiconductor device comprising a semiconductor-on-insulator (SeOI) structure, comprising a substrate, an insulating layer on the substrate, and a semiconductor layer on the insulating layer, wherein a field-effect-transistor (FET) is formed therein. The FET thus formed in the SeOI structure comprises a channel region in the substrate, a dielectric layer formed at least partially from a first part of the insulating layer of the semiconductor-on-insulator structure, and a gate formed at least partially from a first part of the semiconductor layer of the semiconductor-on-insulator structure.

The semiconductor device may include a semiconductor-on-insulator structure that is a silicon-on-insulator (SOI) structure, where the semiconductor layer is a single crystal silicon layer. The semiconductor device may also have an insulating layer that is an oxide that forms a buried oxide (BOX) layer of the semiconductor-on-insulator structure.

In one embodiment of the semiconductor device, the dielectric layer forms a gate dielectric of a FET, where the gate is a gate electrode that is further comprised of a layer of polysilicon on a first part of the semiconductor layer of the semiconductor-on-insulator structure. The semiconductor device may be a floating-gate FET, which further comprises a tunnel dielectric formed at least partially from the insulating layer of the SeOI structure, a floating gate located above the tunnel dielectric and formed at least partially from the semiconductor layer of the SeOI structure, a gate dielectric layer above the floating gate; and a gate electrode formed above the gate dielectric, wherein the floating gate is separated from the gate electrode by the gate dielectric and from the channel region in the substrate by the tunnel dielectric, and each of the layers are in contact with each of the adjacent layers.

The semiconductor device may further comprises at least one other FET formed in the semiconductor-on-insulator structure comprising a channel region and source and drain regions made of a second part of the semiconductor layer of the semiconductor-on-insulator structure, which is separated from a first FET formed in a first part of the semiconductor-on-insulator structure by a shallow trench isolation feature.

In a preferred embodiment, the semiconductor device can have the first part of the semiconductor layer of the SeOI structure and the second part of the semiconductor layer of the SeOI structure at least partially overlap each other.

In another embodiment, the semiconductor device, the first part of the semiconductor layer of the SeOI structure forms at least partially a source or drain region of the other FET.

The semiconductor device can also comprise an additional FET comprising a channel region and source and drain regions made of a third part of the semiconductor layer of the semiconductor-on-insulator structure. The semiconductor device can have the first part of the semiconductor layer of the semiconductor-on-insulator structure different from the third part of the semiconductor layer of the semiconductor-on-insulator structure; and further comprise an insulator region, wherein the insulator region is a shallow trench isolation feature separating the FET comprising the dielectric that is made from a part of the insulating layer of the semiconductor-on-insulator structure from the additional FET. The insulator region can be a shallow trench isolation feature separating the FET made from part of the third part of the semiconductor layer from the FET made from the first part of the semiconductor layer and from the FET made from the second part of the semiconductor layer.

The present invention also relates to the methods for manufacturing a field effect transistor (FET), as described in the embodiments above, in a semiconductor device, which comprises providing a semiconductor-on-insulator (SeOI) structure comprising a substrate, an insulating layer on the substrate; and a semiconductor layer on the insulating layer, forming a polysilicon layer on the semiconductor layer to obtain a polysilicon on SeOI structure, and etching the polysilicon on SeOI structure to form a FET which comprises, a channel region in the substrate, a gate dielectric made from a first part of the insulating layer of the SeOI structure, and a gate electrode at least partially made of a first part of the semiconductor layer of the SeOI structure and a part of the polysilicon layer formed on the semiconductor layer.

In a preferred embodiment, the method for manufacturing a field effect transistor (FET) further comprises introducing dopants into the SeOI structure to create a channel region and a source and a drain region in the substrate or in the semiconductor layer of the SeOI structure. The method may also comprise manufacturing a floating gate FET and a MOSFET on the SeOI structure which comprises forming a gate dielectric on the semiconductor layer of the SeOI structure, forming a gate electrode on a first part of the gate dielectric, wherein at least a part of the semiconductor layer is a floating gate, forming source and drain regions in the semiconductor layer, such that either one of the source or drain regions is at least partly formed of at least a part of the floating gate that is at least a part of the first part of the semiconductor layer of the SeOI structure, wherein the floating gate and either one of the source or drain regions are coupled. The method may further comprise manufacturing a MOSFET on the SeOI structure with the floating gate FET which comprises forming a metal layer on a second part of the gate dielectric and forming a polysilicon layer on the metal layer, and etching the metal layer and polysilicon layer to form a MOSFET gate electrode on the second part of the gate dielectric.

In another preferred embodiment, the method further comprises manufacturing a MOSFET on the SeOI structure comprising forming a gate dielectric on the semiconductor layer of the SeOI structure, wherein the semiconductor layer is a single crystal silicon layer, forming a gate electrode on the gate dielectric, and forming source and drain regions such that one of the source and drain regions is at least partly formed of at least a part of the gate electrode that is at least partially made of the first part of the single crystal silicon layer of the SeOI structure. The method may further comprise manufacturing a MOSFET on the SeOI structure with the floating gate FET which comprises forming a metal layer on a second part of the gate dielectric and forming a polysilicon layer on the metal layer, and etching the metal layer and polysilicon layer to form a MOSFET gate electrode on the second part of the gate dielectric. The method may also further comprises manufacturing a metal-oxide-semiconductor (MOSFET) in addition to a FET, comprising forming a mask layer on the SeOI structure, forming a shallow trench isolation through the mask layer extending to the substrate and separating a first region of the SeOI structure from a second region of the SeOI structure, removing the mask layer from the second region of the SeOI structure, subsequently forming a dielectric layer on the second region of the SeOI structure, forming a metal layer on the dielectric layer, etching the metal layer, the dielectric layer and the SeOI structure in the second region to form a MOSFET in the second region of the SeOI structure, and removing the mask layer from the first region of the SeOI structure, wherein the polysilicon layer is formed on the semiconductor layer in the first region of the SeOI structure after removing the mask layer to obtain the polysilicon layer on SeOI structure and on the metal layer in the second region.

In another preferred embodiment, the method also comprises providing a SeOI structure which comprises providing an silicon-on-insulator (SOI) stack comprising a substrate layer, a first insulating layer on the substrate layer and a single crystal silicon layer on the first insulating layer. The method then involves forming a oxide layer on the single crystal silicon layer, forming a mask layer on the oxide layer, patterning the oxide layer and the mask layer to expose a first part of the single crystal silicon layer, thermally oxidizing the exposed single crystal silicon layer to form a silicon oxide layer on the previously exposed single crystal silicon layer and a first thinned single crystal silicon layer, and removing the oxide layer and the mask layer and the silicon oxide layer formed on the previously exposed single crystal silicon layer, wherein the first part of the single crystal silicon layer of the SOI structure is at least a part of the first thinned single crystal silicon layer. In each of the embodiments, patterning of the oxide layer and mask layer can be done by forming a resist having a pattern on the mask layer, and later removing the resist possibly along with the oxide layer and the mask layer.

In another embodiment of the method, the provided SeOI structure comprises providing a silicon-on-insulator (SOI) stack comprising a substrate layer, a first silicon dioxide layer on the substrate layer, and a single crystal silicon layer on the first silicon dioxide layer, forming a second oxide layer on the single crystal silicon layer, forming a mask layer on the second oxide layer, patterning the second oxide layer and the mask layer to expose a first part of the single crystal silicon layer, subjecting the resulting structure to an anneal process thereby partially dissolving the part of the first silicon dioxide layer beneath the exposed first part of the single crystal silicon layer in order to obtain a thinned silicon dioxide layer, and removing the second oxide layer on the single crystal silicon layer and the mask layer on the second oxide layer, wherein the part of the oxide layer of the SOI structure is at least a part of the thinned silicon dioxide layer.

In a preferred embodiment, the method for manufacturing a floating gate field effect transistor in a semiconductor device, comprises providing a semiconductor-on-insulator (SeOI) structure comprising a substrate, an insulating layer on the substrate and a semiconductor layer on the insulating layer, forming a dielectric layer on the semiconductor layer, forming a polysilicon layer on the dielectric layer to obtain a multilayer structure, and etching the multilayer structure to form a floating-gate FET comprising a channel region in the substrate, a tunnel dielectric made from a part of the insulating layer of the SeOI structure, a floating gate made of a first part of the semiconductor layer of the SeOI structure, a gate dielectric made of a part of the dielectric layer formed on the semiconductor layer, and a gate electrode comprising a part of the polysilicon layer formed on the dielectric layer.

In another embodiment, the method further comprises forming a mask layer on the SeOI structure, forming a shallow trench isolation through the mask layer extending to the substrate and separating a first region of the SeOI structure from a second region of the SeOI structure, removing the mask layer from the second region of the SeOI structure, subsequently forming a second dielectric layer on the second region of the SeOI structure, forming a metal layer on the second dielectric layer, removing the mask layer from the first region of the SeOI structure, and etching the metal layer, the second dielectric layer and the SeOI structure in the second region to form the MOSFET in the second region of the SeOI structure; and wherein the dielectric layer is formed on the semiconductor layer and the polysilicon layer is formed on the dielectric layer to obtain a multilayer structure in the first region of the SeOI structure. In another embodiment, the semiconductor-on-insulator (SeOI) structure may be a silicon-on-insulator (SOI) structure, wherein the semiconductor layer may be a single crystal silicon layer.

The method may further comprise forming a mask layer on the SeOI structure, forming a shallow trench isolation through the mask layer extending to the substrate and separating a first region of the SeOI structure from a second region of the SeOI structure, removing the mask layer from the second region of the SeOI structure, subsequently forming a second dielectric layer on the second region of the SeOI structure, forming a metal layer on the second dielectric layer, removing the mask layer from the first region of the SeOI structure, and etching the metal layer, the second dielectric layer and the SeOI structure in the second region to form the MOSFET in the second region of the SeOI structure; and wherein the dielectric layer is formed on the semiconductor layer and the polysilicon layer is formed on the dielectric layer to obtain a multilayer structure in the first region of the SeOI structure.

In each of the embodiments, the semiconductor-on-insulator (SeOI) structure may be a semiconductor, such as germanium or silicon-germanium, or may also be a silicon-on-insulator (SOI) structure, wherein the semiconductor layer is a single crystal silicon layer, and the insulating layer may preferably be an oxide layer and more preferably a silicon dioxide layer that can form a buried oxide layer.

BRIEF DESCRIPTION OF THE DRAWINGS

FIGS. 4a, 4b and 4c illustrate an example for the method for manufacturing a semiconductor device according to the present invention, wherein a floating-gate FET is formed that comprises a part of a BOX layer of an SOI structure as a tunnel dielectric.

DETAILED DESCRIPTION OF THE INVENTION

Figure 1A:
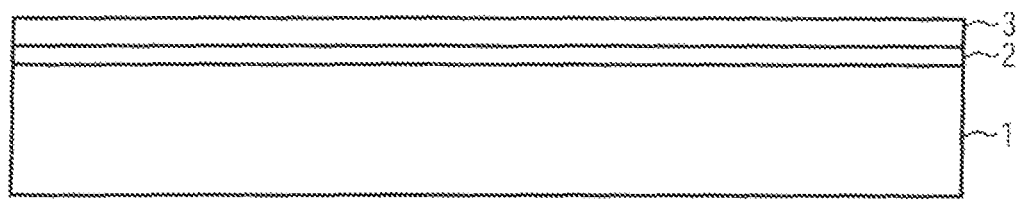
FIGS. 1a-1g illustrate an example for the method for manufacturing a semiconductor device according to the present invention, wherein an FET is formed that comprises a part of a buried oxide (BOX) layer of an SOI structure as a gate dielectric.

The present invention relates to a semiconductor device comprising a semiconductor-on-insulator (SeOI), in particular, a silicon-on-insulator (SOI), structure comprising a substrate, an insulating layer such as a buried oxide layer (BOX layer) on the substrate and a semiconductor layer, in particular, a single crystal silicon layer, on the oxide layer; with a field-effect-transistor (FET) formed therein, wherein the FET comprises a channel region in the substrate; a dielectric layer being at least a part of the oxide layer of the semiconductor-on-insulator structure; and a gate at least partially being a first part of the semiconductor layer of the semiconductor-on-insulator structure.

In a preferred embodiment the dielectric layer forms the gate dielectric of the FET and the gate is a gate electrode that, in particular, may further comprise a layer of polysilicon on a part of the semiconductor layer of the semiconductor-on-insulator structure, or for example a single crystal silicon layer of a silicon-on-insulator structure, that at least partially forms the gate.

In the following examples of an SeOI structure, a preferred embodiment of a SOI structure comprising a silicon single crystal layer is described, however, it is to be understood that any semiconductor-on-insulator (SeOI) structure without restriction to silicon can be encompassed in the present invention.

Insulator regions may be formed in the SeOI structure, where in a preferred embodiment of the invention the insulator regions are shallow trench isolation(s) (STI), that separate the SeOI structure into regions. The oxide layer and semiconductor layer are divided into sections by the STI. The components of a FET may be formed from parts of the separate layer sections. The insulator regions may also extend into the substrate thereby separating a first channel formed in one region of a SeOI structure from a second channel formed in an adjoining region of the SeOI structure.

Thus according to the present invention, FETs with gate dielectrics in the form of parts of the initial BOX layers of SOI structures are provided that, furthermore, have gate electrodes that are at least partially formed from parts of the single crystal silicon layers of the SOI structures. Thereby, improved electrode characteristics are provided due to the single crystal silicon layer, where in the art usually only polysilicon is used for the gate material, and the material properties of the interface between the gate dielectric and the gate electrode is significantly improved. In the art, a polysilicon—oxide interface is provided between the gate electrode and the gate dielectric resulting in grain boundaries and inhomogeneous dopant profiles, where as according to the present invention, a single crystal silicon—oxide interface is provided between the gate electrode and the gate dielectric, thereby avoiding grain boundaries resulting in inhomogeneous dopant profiles and affecting the long time operation reliability of high-performance transistors, as well as contributing to $V_T$ variability. Thus the provided transistors are particularly suitable for high-voltage applications, for example, in the context of RF devices and electrostatic discharge (ESD) protections, In another preferred embodiment the FET is a floating-gate FET and the gate dielectric is a tunnel dielectric and the gate is a floating-gate. The floating-gate FET may further comprise a gate dielectric on the floating gate and a gate electrode, in particular, made of polysilicon, on the gate dielectric. Again, a single crystal silicon—oxide interface can be provided this time between the floating gate and the tunnel dielectric. The single crystal silicon—oxide interface results in improved charge/data retention as compared to the conventional polysilicon—oxide interface. Thus, this embodiment is particularly suitable for the manufacture of high-voltage FLASH memory devices. Manufacture of the floating-gate FET is compatible with the manufacture of the FET comprising a part of the BOX layer as a gate dielectric and a gate electrode that is at least partly made of single crystal silicon as described above.

It should be noted that in the above-described examples the substrate of the SOI structure may be a polysilicon substrate, and the BOX layer may be provided in form of a silicon dioxide layer, for example. The SOI structure may be obtained by the SMARTCUT© process.

The above-described examples for the inventive FET are particularly suitable for co-integration with conventional bulk transistors on SOI (MOSFETs). Thus, the semiconductor device according to one of the above-described examples may further comprise one other FET comprising a channel region and source-drain regions both made of parts of the single crystal silicon layer of the SOI structure from a second section of the SOI layers. Additionally, the other FET may comprise a dielectric layer, particularly, comprising a low-k material, formed on the channel region that is located in the single crystal silicon layer of the SOI and a gate metal layer formed on this gate dielectric layer.

According to another embodiment of the invention, the first section of the silicon layer of the SOI structure is different from the second section of the silicon layer of the SOI structure, and an insulator region, in particular, a shallow trench isolation (STI) feature, is provided separating the one FET comprising the dielectric that is made from a first part of the oxide layer of the SOI structure from the other FET comprising a channel region and source-drain regions both made of the second part of the single crystal silicon layer of the SOI structure. Alternatively, the first part of the single crystal silicon layer of the SOI structure and the second part of the single crystal silicon layer of the SOI structure at least partially overlap each other. In particular, it is the top drain adjacent to the channel region of the upper FET formed in the semiconductor layer and the bottom gate for the channel region of the lower FET formed in the substrate that overlap. This arrangement of the top drain and bottom gate creates a coupled region or junction with both an adjacent channel of the upper FET and subjacent channel of the lower FET. This is in contrast to embodiments in which each FET formed in the SeOI structure has its own individual source, drain, channel and gate, that are physically and electrically separate from any other FET on the SeOI structure, and which preferably have each FET separated by an insulator region such as a shallow trench isolation feature. In one embodiment, the first part of the single crystal silicon layer of the SOI structure (functioning as a gate for the inventive transistor) may form at least partially a source or drain region of the other (conventional) FET.

In both cases the process flow for the manufacture of the transistors readily allows for the co-integration of both transistor devices. When the first part of the single crystal silicon layer of the SOI structure forms at least partially a source or drain region of the other FET a very compact configuration arises that allows for minimizing the necessary space.

Moreover, the semiconductor device may comprise the FET of the present invention comprising the dielectric that is made from a part of the oxide layer of the SOI structure, a conventional MOSFET separated from that FET and an additional conventional MOSFET with a source or drain region shared with the gate of the inventive FET comprising the dielectric that is made from a part of the oxide layer of the SOI structure.

The present invention also provides a method for manufacturing a semiconductor device comprising providing a silicon-on-insulator structure comprising a substrate, an oxide layer on the substrate and a single crystal silicon layer on the oxide layer; forming a polysilicon layer on the single crystal silicon layer to obtain a polysilicon on SOI structure; and etching the polysilicon on SOI structure to form a FET, wherein the FET comprises a channel region in the substrate, a gate dielectric made from a part of the oxide layer of the SOI structure and a gate electrode that is at least partially made of a first part of the single crystal silicon layer of the SOI structure and a part of the polysilicon layer formed on the single crystal silicon layer. The etching may be performed based on a photoresist formed and patterned on the polysilicon layer on the SOI structure.

Whereas in the following embodiments of the inventive methods are described with reference to an silicon-on-insulator structure comprising a single crystal silicon layer on a buried oxide layer, in principle, any other suitable semiconductor material can be used. Thus, it is to be understood that the invention covers a semiconductor-on-insulator (SeOI) structure, for example, comprising germanium or silicon-germanium layer on an oxide layer, and is not restricted to a SOI structure.

The method may further comprise the steps of forming a mask layer on the SOI structure; forming a shallow trench isolation feature through the mask layer extending to the substrate and separating a first region of the SOI structure from a second region of the SOI structure; removing the mask layer from the second region of the SOI structure; subsequently forming a dielectric layer on the second region of the SOI structure; forming a metal layer on the dielectric layer; and removing the mask layer from the first region of the SOI structure; and etching the metal layer, the dielectric layer and the SOI structure in the second region to form a MOSFET in the second region of the SOI structure; and wherein the polysilicon layer is formed on the single crystal silicon layer in the first region of the SOI structure to obtain the polysilicon on SOI structure and on the metal layer.

Co-integration with a conventional MOSFET can easily be realized. Thus, the method according to the above examples may further comprise manufacturing a MOSFET on the SOI structure comprising the steps of forming a gate dielectric on the single crystal silicon layer of the SOI structure; forming a gate electrode on the gate dielectric; and forming source and drain regions such that one of the source and drain regions is at least partly formed of at least a part of the gate electrode that is at least partially made of the first part of the single crystal silicon layer of the SOI structure.

Moreover, a method is provided for manufacturing a semiconductor device, comprising providing a silicon-on-insulator structure comprising a substrate, an oxide layer on the substrate and a single crystal silicon layer on the oxide layer; forming a dielectric layer on the single crystal silicon layer; forming a polysilicon layer on the dielectric layer to obtain a multilayer structure; and etching the multilayer structure to form a floating-gate FET comprising a channel region in the substrate, a tunnel dielectric made from a part of the oxide layer of the SOI structure, a floating gate made of a first part of the single crystal silicon layer of the SOI structure, a gate dielectric made of a part of the dielectric layer formed on the single crystal silicon layer and a gate electrode comprising a part of the polysilicon layer formed on the dielectric layer.

Again, the etching step may be performed based on a photoresist formed and patterned on the polysilicon layer on SOI structure. This method, including the formation of a floating-gate transistor, may also comprise the steps of forming a mask layer on the SOI structure; forming shallow trench isolation feature(s) through the mask layer extending to the substrate and separating a first region of the SOI structure from a second region of the SOI structure; removing the mask layer from the second region of the SOI structure; subsequently forming another dielectric layer on the second region of the SOI structure; forming a metal layer on the other dielectric layer; removing the mask layer from the first region of the SOI structure; and etching the metal layer, the other dielectric layer and the SOI structure in the second region to form the MOSFET in the second region of the SOI structure; and wherein the dielectric layer is formed on the single crystal silicon layer and the polysilicon layer is formed on the dielectric layer to obtain a multilayer structure in the first region of the SOI structure.

Again, co-integration with a conventional MOSFET can easily be realized. Thus, the method related to a floating-gate transistor according to the above examples may further comprise manufacturing a MOSFET on the SOI structure comprising the steps of forming a gate dielectric on the single crystal silicon layer of the SOI structure; forming a gate electrode on the gate dielectric; and forming source and drain regions such that one of the source and drain regions is at least partly formed of at least a part of the floating gate that is at least partially made of the first part of the single crystal silicon layer of the SOI structure.

In the above-described examples of the inventive semiconductor device and method an SOI structure is involved. The SOI structure may have a buried oxide (BOX) layer with varying thickness. In particular, the thickness of the BOX layer may be adapted to be suitable for a dielectric layer of a high-performance FET or a tunnel dielectric of a floating-gate FET.

An SOI structure with a varying thickness of the BOX layer may be obtained by providing an SOI stack comprising a substrate layer, a first silicon (di)oxide layer on the substrate layer and a single crystal silicon layer on the first silicon (di)oxide layer; forming an oxide layer, which can be a second silicon (di)oxide layer, on the single crystal silicon layer and a mask layer on the second oxide layer; patterning the second oxide layer and the mask layer to expose a first part of the single crystal silicon layer; subjecting the resulting structure to an anneal process thereby partially dissolving the part of the first silicon (di)oxide layer beneath the exposed first part of the single crystal silicon layer in order to obtain a thinned silicon (di)oxide layer; and removing the second oxide layer and the mask layer.

The thinned silicon (di)oxide layer can subsequently serve as a dielectric layer or tunnel dielectric in the above-described examples of the present invention, i.e. the part of the oxide layer of the SOI structure the gate dielectric or floating dielectric is made from is at least a part of the thinned silicon (di)oxide layer.

The high-temperature anneal process can be performed at a temperature of 900° C. to 1200° C. in an annealing atmosphere comprising Ar and/or $N_2$, thereby partially dissolving the part of the first oxide layer beneath the first thinned silicon layer in order to obtain a first thinned silicon oxide layer.

Thus, synergetically the advantage is provided to obtain an SOI structure with a BOX layer of varying thickness such that the thickness of the BOX layer can properly be adapted to fulfill standards for a gate dielectric or tunnel dielectric of a FET or floating-gate FET, respectively, that is manufactured according to the present invention.

Moreover, the thickness of the single crystal silicon layer can be adjusted to the particular needs for a reliably operating gate electrode or floating gate, respectively. In particular, the SOI structure in the above-described examples may be formed comprising the steps of providing an SOI stack comprising a substrate layer, a first oxide layer on the substrate layer and a single crystal silicon layer on the first oxide layer; forming a second oxide layer on the single crystal silicon layer and a mask layer on the second oxide layer; patterning the second oxide layer and the mask layer to expose a first part of the single crystal silicon layer; thermally oxidizing the exposed single crystal silicon layer to form a silicon oxide layer on the previously exposed single crystal silicon layer and a first thinned single crystal silicon layer; and removing the second oxide layer and the mask layer and the silicon oxide layer formed on the previously exposed single crystal silicon layer; and wherein a first part of the silicon layer of the SOI structure is at least a part of the first thinned single crystal silicon layer.

The thermal oxidation processing can be performed in an oxygen atmosphere, in particular, comprising $O_2/H_2$ or $O_2/H_2/HCl$ or $O_2/HCl$ and/or at a temperature of 800° C. to 1000° C.

The mask layers can be nitride layers, in particular, silicon nitride layers or a stack of oxide/nitride layers. The steps of the above examples for adjusting the thickness of the BOX layer or of the single crystal silicon layer can be repeated. Thus the method comprising the anneal processing for thinning the BOX layer may further comprise the steps of forming a third oxide layer and another mask layer on the exposed first part of the single crystal silicon layer; patterning the third oxide layer and the other mask layer to expose a second part of the single crystal silicon layer; and subjecting the resulting structure to another anneal process thereby partially dissolving the part of the first thinned silicon oxide layer beneath the exposed second part of the single crystal silicon layer in order to obtain a second thinned silicon oxide layer.

Similarly, the method comprising the step of thermal oxidation for forming a thinned single crystal silicon layer may further comprise the steps of forming a second mask layer on a part of the silicon oxide layer and thermally oxidizing a part of the first thinned silicon layer located beneath the part of the silicon oxide layer that is not covered by the second mask layer thereby forming another silicon oxide layer and a second thinned single crystal silicon layer.

It should be noted that, in particular, dissolution of the buried oxide in the SOI structure is performed before the further processing comprising STI formation and dopant implantation and diffusion. The STI is arranged at the transition zones between the dissolved and originally provided BOX layer.

Additional features and advantages of the present invention will be described with reference to the drawings. In the description, reference is made to the accompanying figures that are meant to illustrate preferred embodiments of the invention. It is understood that such embodiments do not represent the full scope of the invention.

Figure 1B:
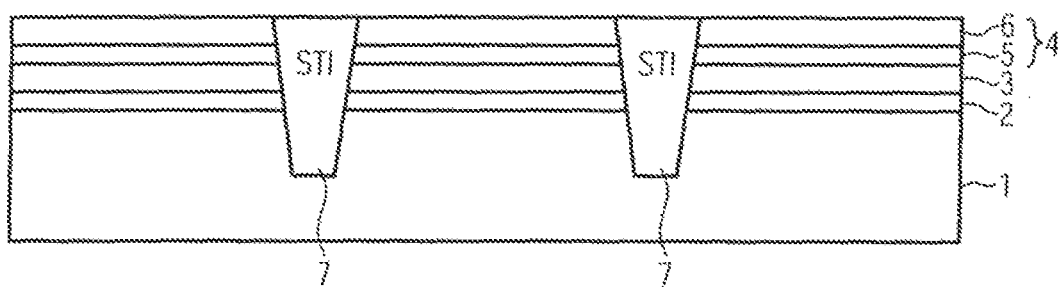

In FIGS. 1a-1g the stages of a preferred embodiment of manufacturing a semiconductor device according to the invention are shown. The semiconductor device is manufactured by first providing an SOI structure comprising a polysilicon substrate 1, an insulating layer, such as a buried oxide layer 2 (BOX layer), that can be made of silicon dioxide for example, and a single crystal silicon layer 3 is shown in FIG. 1a. As shown in FIG. 1b a hard mask layer 4 is grown or deposited on top of the silicon layer 3. In the example shown, the hard mask layer comprises a thin oxide layer 5 and a silicon nitride layer 6. A photoresist (not shown) is deposited on the hard mask layer 4 and patterned for the formation of shallow trench isolations (STI) 7. For this purpose, the hard mask layer 4, the silicon layer 3 and the BOX layer 2 are etched and the resulting trench is extended partly into the substrate 1. Then, the trench is filled by one or more dielectric materials, for example silicon dioxide, and the excess dielectric is removed from the surface of the mask layer 5 by chemical-mechanical planarization. As shown in FIG. 1b, the shallow trench isolation features separate the buried oxide layer 2 and single crystal silicon layer 3 into two or more sections or parts, and extends below the BOX layer into the substrate to separate a first region of the substrate from a second region of the substrate.

Figure 1C:
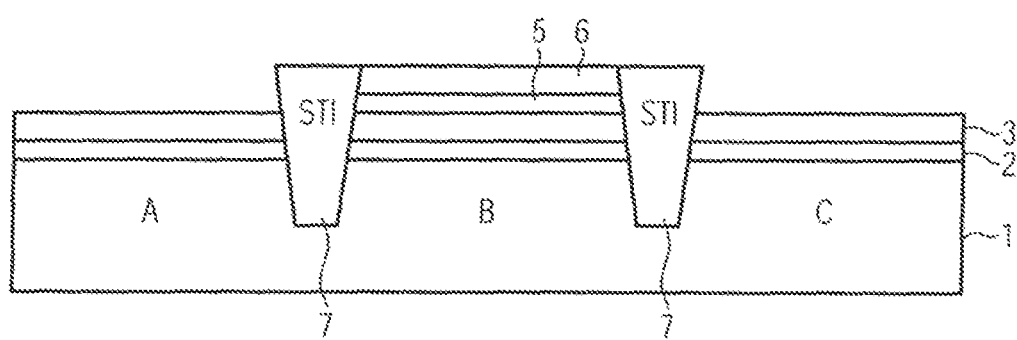
Figure 1D:
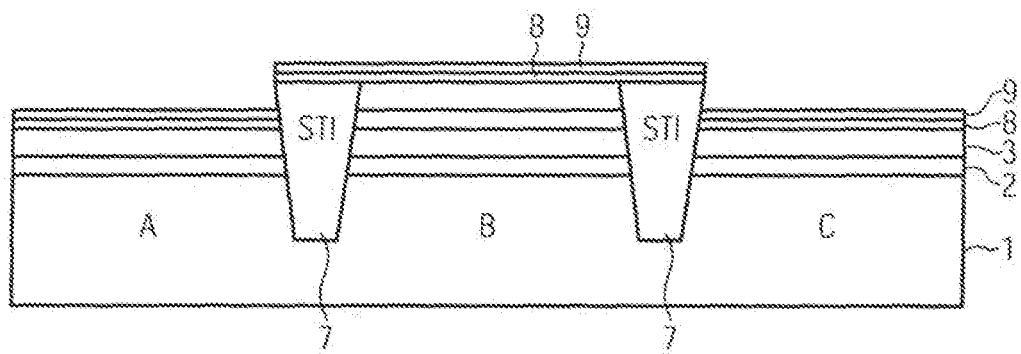

As shown in FIG. 1c, the hard mask layer 4 is removed from regions A and C to expose the single crystal silicon layer 3 in these regions. Then, as shown in FIG. 1d, a high-k dielectric layer 8 (for example, with a dielectric constant k more than 3.9) is formed on the exposed surfaces of the single crystal silicon layer 3 and silicon nitride layer 6 of region B as well as on top of the shallow trench isolations 7 and, subsequently a metal layer 9 is formed atop of the high-k dielectric layer 8. The high-k dielectric layer 8 may be made of silicon nitride or a composite material (SiON, $Al_2O_3$, $HfO_2$, etc. . . . ) and the metal layer 9 may be made of TiN, W, TaN, and ternary components (Ti—Ta—N) etc., for example (see FIG. 1d).

Figure 1E:
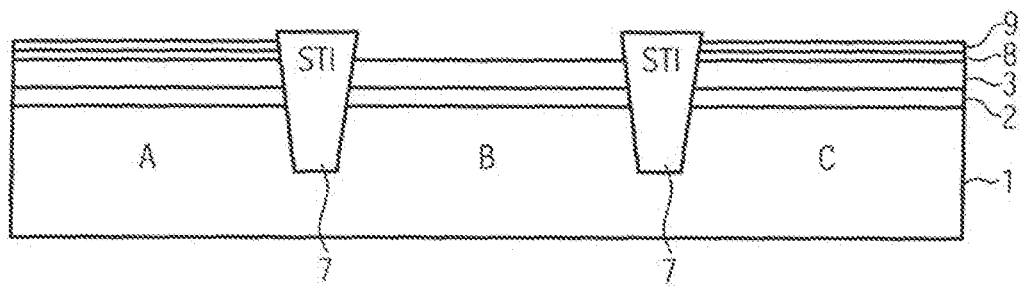
Figure 1F:
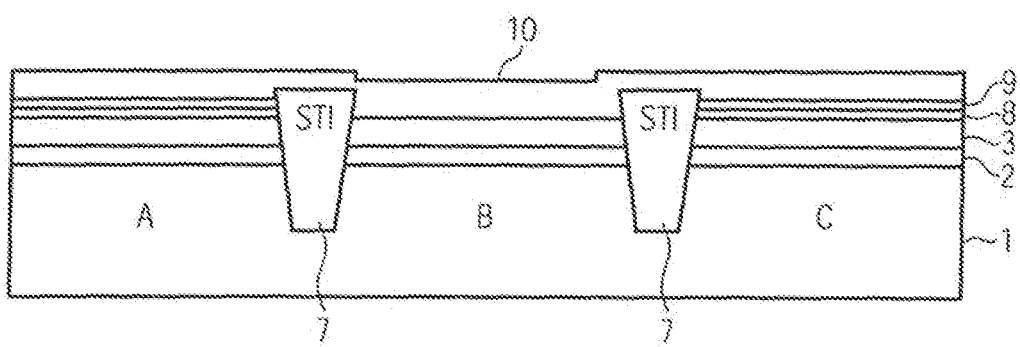
Figure 1G:
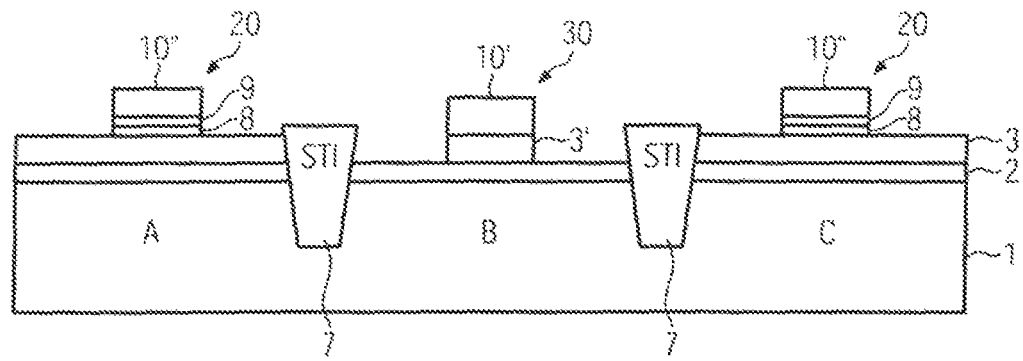

In the stage shown in FIG. 1e, the layers 8 and 9 are removed from the region B between the shallow trench isolations 7 and from the shallow trench isolations 7, and the remaining mask layer 4 is removed from the region B between the shallow trench isolations 7. Subsequently, a polysilicon layer 10 is deposited, as it is shown in FIG. 1f. A photoresist (not shown) is formed atop the resulting structure and patterned for etching to form gate electrodes in the regions A, B and C (see FIG. 1g). In the example, shown in FIG. 1g, three FETs are formed. In regions A and C conventional MOSFETs 20 on SOI result. The channel regions of the conventional MOSFETs 20 are located below the gate dielectrics 8 in the silicon layer 3. Adjacent to the channel regions source and drain regions are formed by n or p carrier type dopants as known in the art. Gate electrodes of the MOSFETs 20 are formed from the metal layer 9 and also include the etched polysilicon material 10".

The inventive FET 30 is formed separated from the conventional MOSFETs 20 by the trench isolations 7. The inventive FET 30 is characterized by a gate dielectric formed from the original BOX layer 2 provided in the SOI structure shown in FIG. 1a and a gate electrode that comprises single crystal silicon 3' formed from the original single crystal silicon layer 3 provided in the SOI structure shown in FIG. 1a. Polysillicon layer 10' is also formed as part of the gate electrode. N or P dopants adjacent to the channel region provided in the substrate 1 below the gate dielectric provide source and drain regions. As compared to the art and MOSFETs 20 in FIG. 1g, in the inventive FET the BOX layer of an SOI structure is used as the gate dielectric and the single crystal silicon of the SOI structure is used as part of the gate electrode. Thereby, a better interface between the gate dielectric (silicon dioxide) and the gate electrode (single crystal silicon) as compared to the prior art is achieved. Operation of high-voltage high performance transistors can, thereby, be made more reliable. It is noted that depending on the desired properties of the gate dielectric the BOX layer 2 may be provided with a lower thickness in region B than in regions A and C.

Figure 2A:
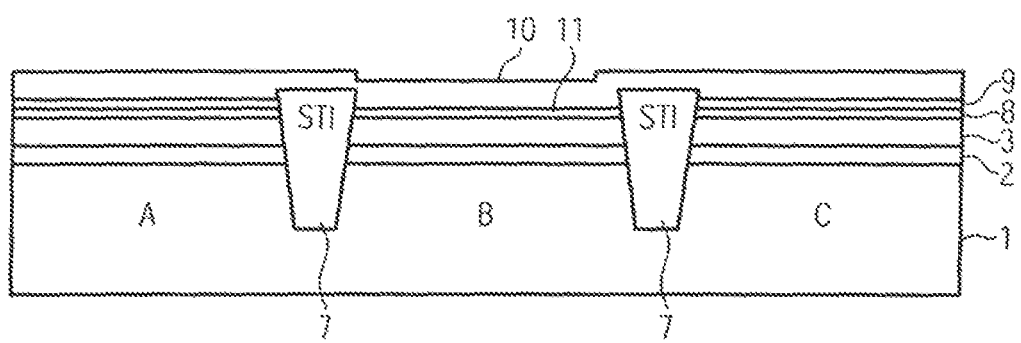
FIGS. 2a-2g illustrate further examples for the method for manufacturing a semiconductor device according to the present invention, wherein a floating-gate FET is formed that comprises a part of a BOX layer of an SOI structure as a tunnel dielectric.
Figure 2B:
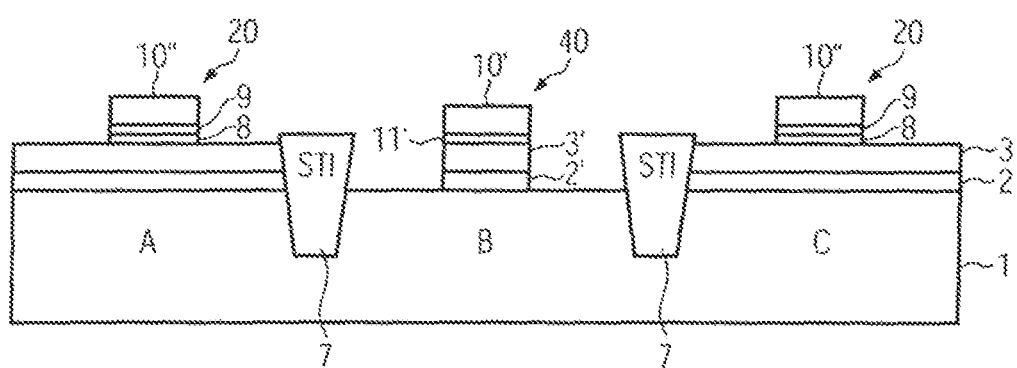
Figure 2C:
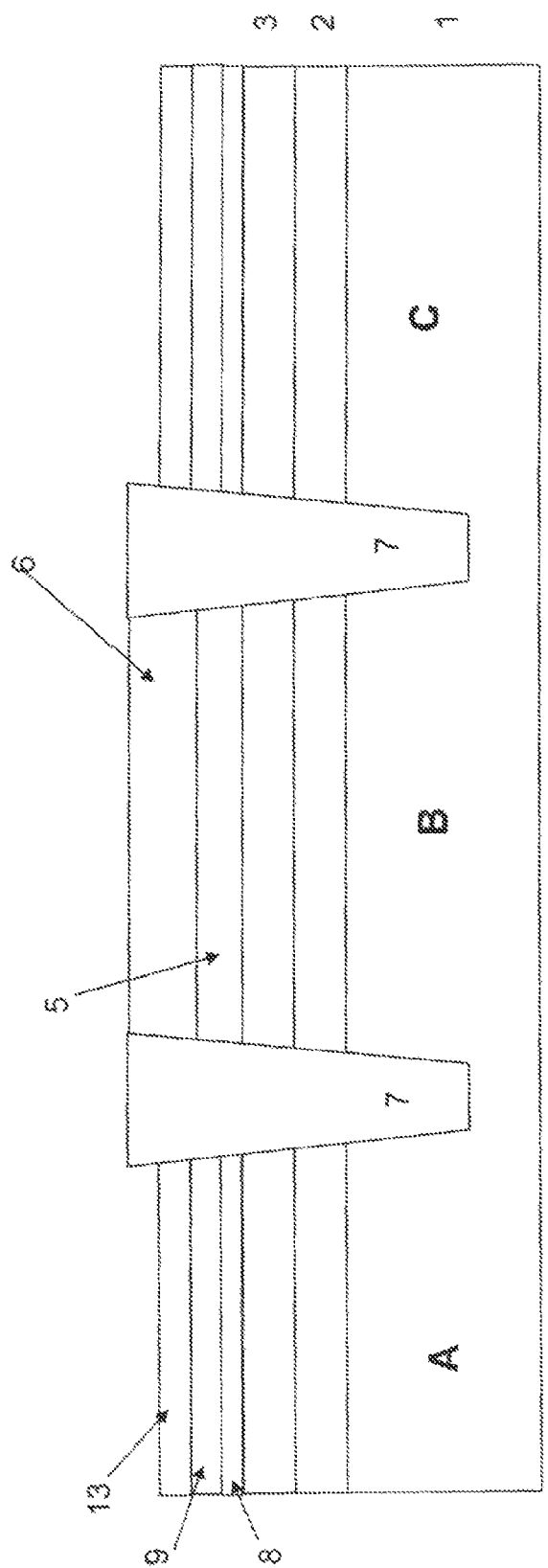

FIGS. 2a and 2b illustrate another example for the method for manufacturing a semiconductor device according to the present invention. According to this example, a floating-gate FET is formed that comprises a part of a BOX layer of an SOT structure as a tunnel dielectric and a part of a single crystal silicon layer of the SOI structure as a floating gate. One may start from the configuration shown in FIG. 1e. The exposed surface of the single crystal silicon layer 3 is thermally oxidized at some 700° C. to 900° C., for example, in order to grow oxide dielectric layer 11 (see FIG. 2a). Alternatively, a dielectric layer 11, for instance, a silicon oxide layer, may be grown or deposited on the exposed surface of the single crystal silicon layer 3. Subsequently, a polysilicon layer 10 is deposited on the metal layer 9 in regions A and C and on the dielectric layer 11.

As it was described above with reference to FIG. 1g the configuration shown in FIG. 2a is etched in order to form two MOSFETs 20 in regions A and C. In addition a floating-gate FET 40 is formed that is separated from the MOSFETs 20 by the shallow trench isolations 7. The shallow trench isolation extends below the BOX layer into the substrate to separate a first region A and third region C of the substrate that may include the MOSFET devices 20 from a second region B of the substrate that may include a different FET device 30 or 40. Due to the above-described processing steps the floating-gate FET 40 in region B (see FIG. 2b) comprises a channel region in the substrate 1 below the tunnel dielectric 2'. At both sides of the channel region source and drain regions are provided by appropriate doping of the substrate 1. The floating-gate FET 40, furthermore, comprises a floating gate 3' above the tunnel dielectric 2'. The floating gate 3' is separated from the gate electrode 10' by the gate dielectric 11'. As compared to conventional floating-gate FETs the better single crystal silicon—oxide (floating gate—tunnel dielectric) interface allows for improved data retention when the floating-gate FET is used as a memory device. A reliable high-voltage FLASH device can, thus, be provided. It is noted that depending on the desired properties of the tunnel dielectric the BOX layer in the starting SOI structure may be provided with a lower thickness in region B than in regions A and C.

An alternative example for the manufacture of a semiconductor device according to the present invention is illustrated in FIGS. 2c to 2g. The process flow starts from the structure shown in FIG. 1c. A high-k dielectric layer 8 is grown or deposited on single crystal silicon layer 3 in regions A and C. A metal gate layer 9 is formed atop of the high-k dielectric layer 8 (see FIG. 2c). Subsequently, a thin polysilicon layer 13 is formed on the metal gate layer 9 in regions A and C. The formation of layers 8, 9 and 13 over regions A and C comprises continuous formation of the layers over regions A, B and C and a lithographic step for removing the layers from region B (and the shallow trench insulation region 7) by employing a photoresist mask (not shown) patterned to cover regions A and C, respectively. After etching the regions exposed by the photoresist mask the configuration shown in FIG. 2c results.

Figure 2D:
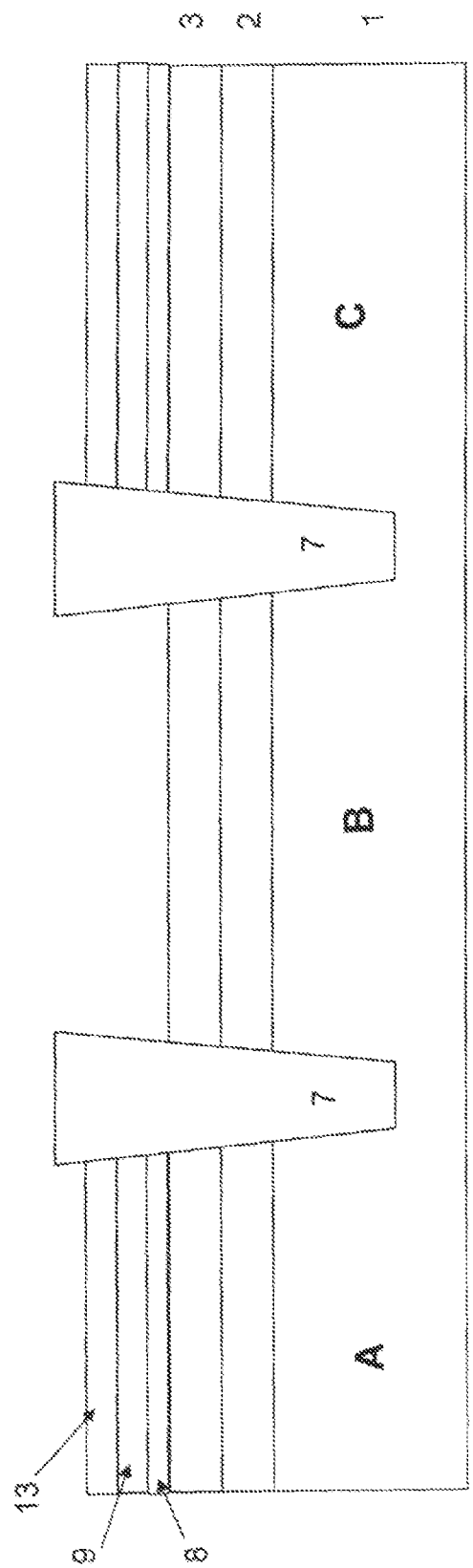
Figure 2E:
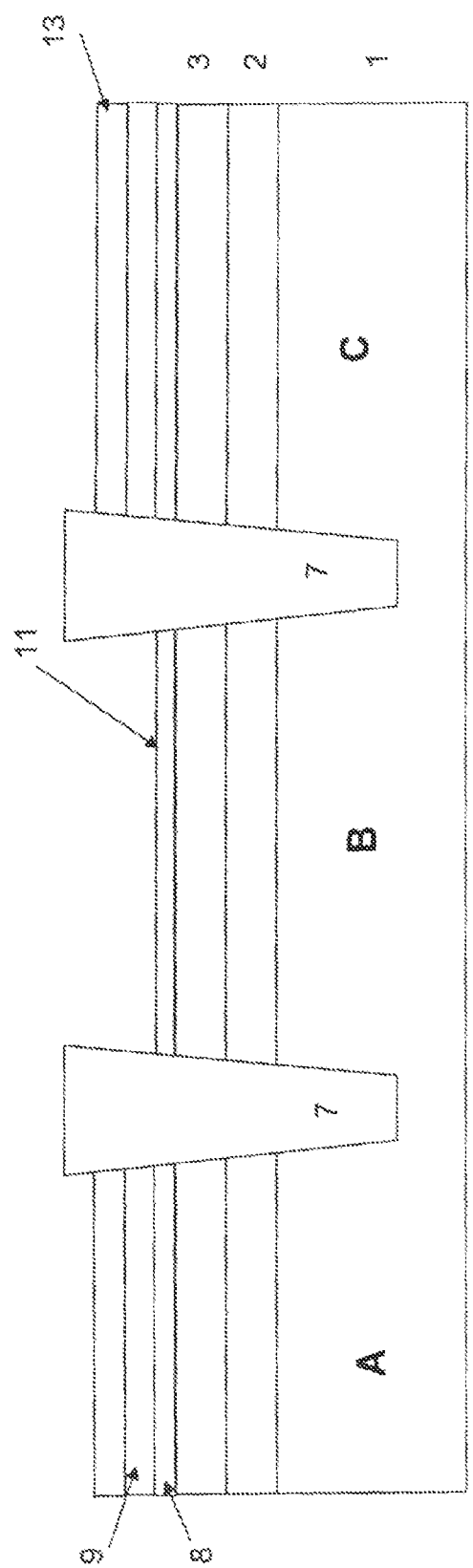
Figure 2F:
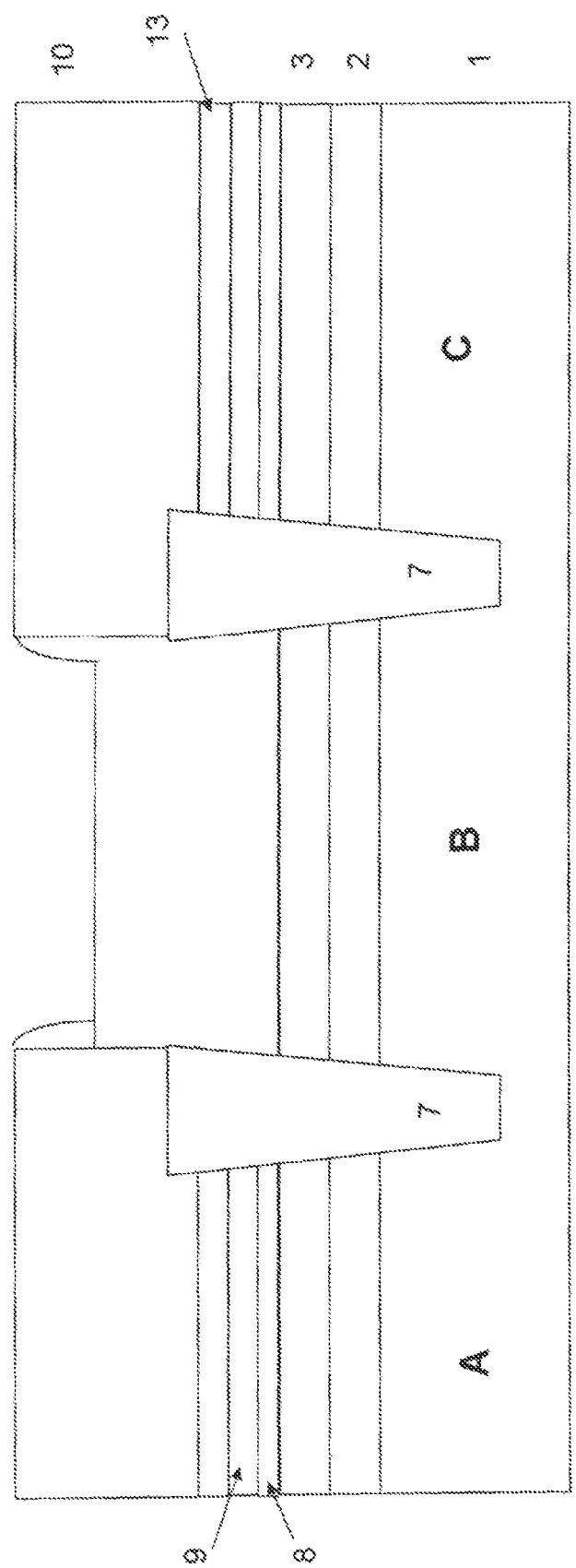
Figure 2G:
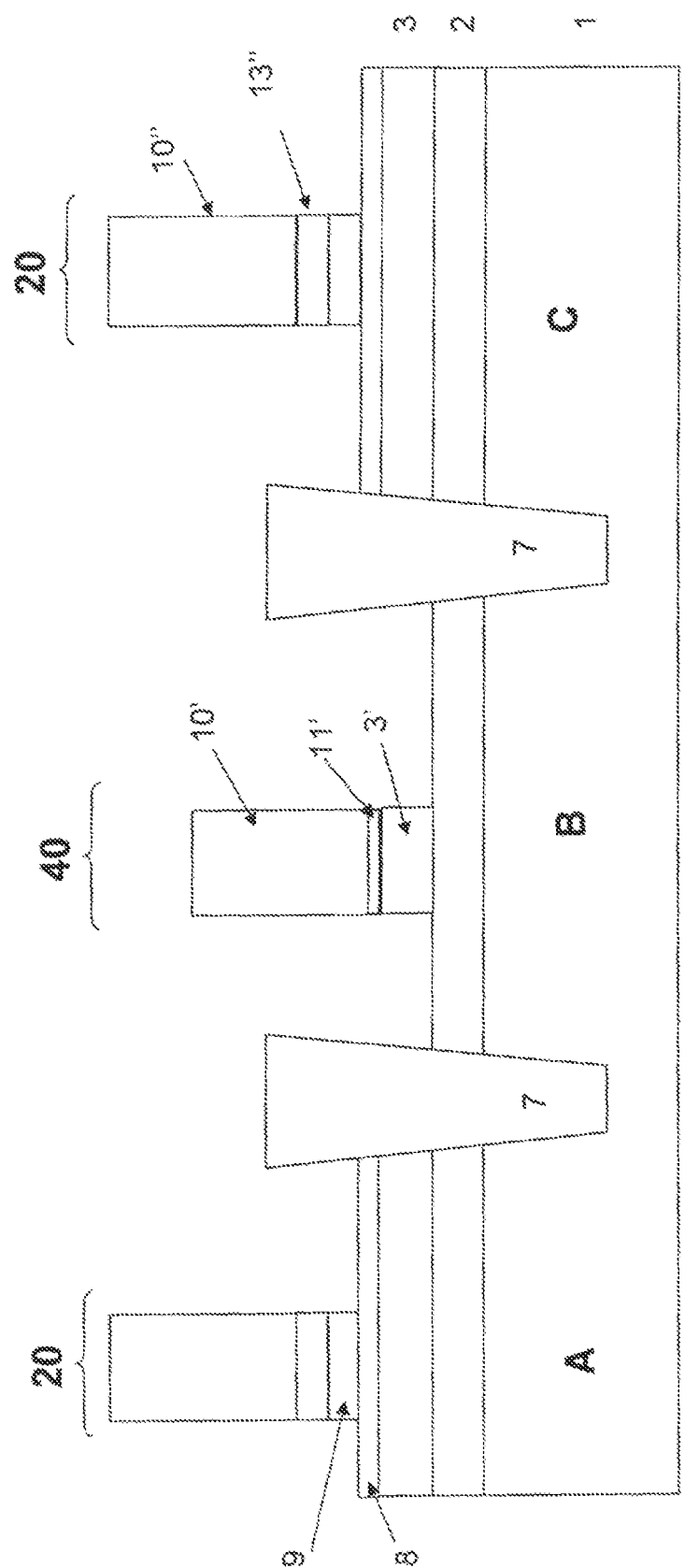

Subsequently, the hard mask (5 and 6) is removed in region B as is shown in FIG. 2d. The thus exposed crystal silicon layer 3 is oxidized in region B to obtain an oxidized layer 11 as is shown in FIG. 2e. Alternatively, a dielectric layer 11 is formed on the exposed crystal silicon layer 3. Subsequently, a polysilicon layer 10 for forming a gate electrode is deposited as it is shown in FIG. 2f. Thereby, a configuration similar to the one shown in FIG. 2a but including the thin polysilicon layer 13 is obtained.

Similar to the example shown in FIG. 2b by means of an appropriately patterned photoresist mask and etching, the structure shown in FIG. 2f results. This structure comprises gate structures for circuits in regions A, B and C. In particular, the gate structures comprise the gate dielectric 8, gate metal layer 9 and both etched polysilicon gate material 10" and etched thin polysilicon layer 13 in regions A and C.

As it is described with reference to FIGS. 1a to 1g and FIGS. 2a to 2g, the inventive transistor devices can be manufactured in co-integration with conventional SOI based transistors. However, it goes without saying that the above-described exemplary examples for the manufacture of the semiconductor device may be amended in a manner not to include the formation of the conventional MOSFETs 20.

Figure 3:
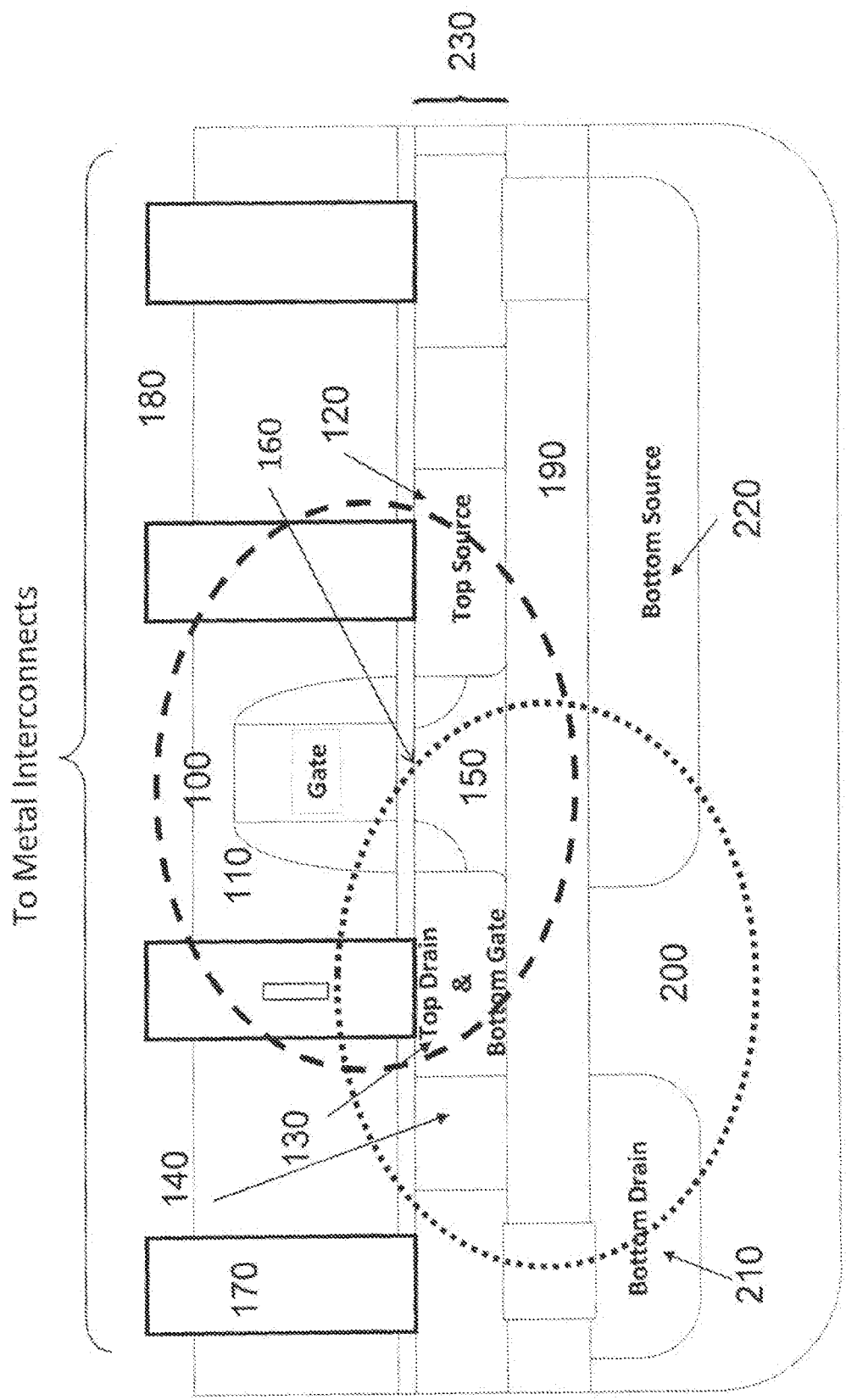
FIG. 3 illustrates an example of a semiconductor device according to the present invention comprising a MOSFET and a lower positioned FET wherein the drain of the MOSFET also functions as a gate of the lower positioned FET.

Not only co-integration of the inventive devices with conventional, bulk transistors on SOI is possible but rather a new densely packed combination of different transistors is available. As it is illustrated in FIG. 3, according to another example of the present invention, a configuration comprising in a particular manner a conventional SOI MOSFET and an inventive FET is provided. According to the example shown, a conventional MOSFET comprising a gate electrode 100 and sidewall spacers 110 used for the formation of source and drain regions is formed according to SOI technology. The source and drain regions of this MOSFET are designated as "top source" 120 and "top drain" 130, respectively. These top source 120 and top drain 130 regions are formed in a single crystal silicon layer 230 of the SOI structure. Insulation regions 140 are provided adjacent to the source/drain regions. The gate electrode 100 is separated from the channel region 150 that is located between the top source 120 and top drain region 130 by a gate dielectric 160. The top drain 130 in the single crystal silicon layer 230 overlaps the bottom gate which is separated from the channel in substrate 200 by an insulation layer 190. In the example shown in FIG. 3, the contacts 170 are formed in another dielectric material 180 covering the MOSFETs. The contacts 170 provide connection to metal interconnects of a metallization layer, for example. The insulator layer 190 can be an oxide layer. The MOSFET is indicated by an ellipsoid dashed contour.

The single crystal silicon layer 230 is located atop of a BOX layer 190. The BOX layer 190 is located above a substrate 200, for example, a silicon substrate 200. However, according to the shown example the drain 130 of the MOSFET indicated by the ellipsoid dashed contour also functions as a gate electrode designated as "bottom gate" of an FET located partially below the MOSFET. The FET that is indicated by the ellipsoid dotted contour comprises the part of the single crystal silicon layer 230 that functions as a drain 130 for the upper MOSFET, a part of the insulating BOX layer 190 functions as a gate dielectric, and a drain region 210 and a source region 220 are provided by appropriate implantation and diffusion of dopants in the substrate 200 of the SOT structure. A channel region is disposed between the bottom source 220 and bottom drain 210 regions, and below the overlapping top drain and bottom gate 130. All of the source and drain regions of the two transistors (and thus the bottom gate of the lower positioned FET) are connected to the contacts 170. Consequently, a very compact semiconductor device comprising a MOSFET on SOT and a FET comprising a BOX layer dielectric and single crystal silicon gate electrode can be obtained.

Figure 4A:
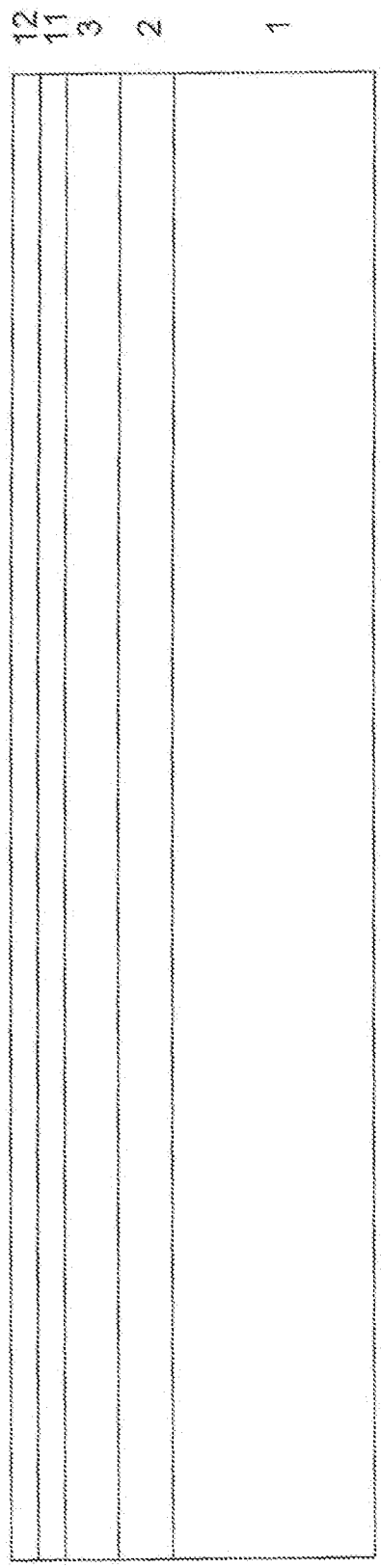
Figure 4B:
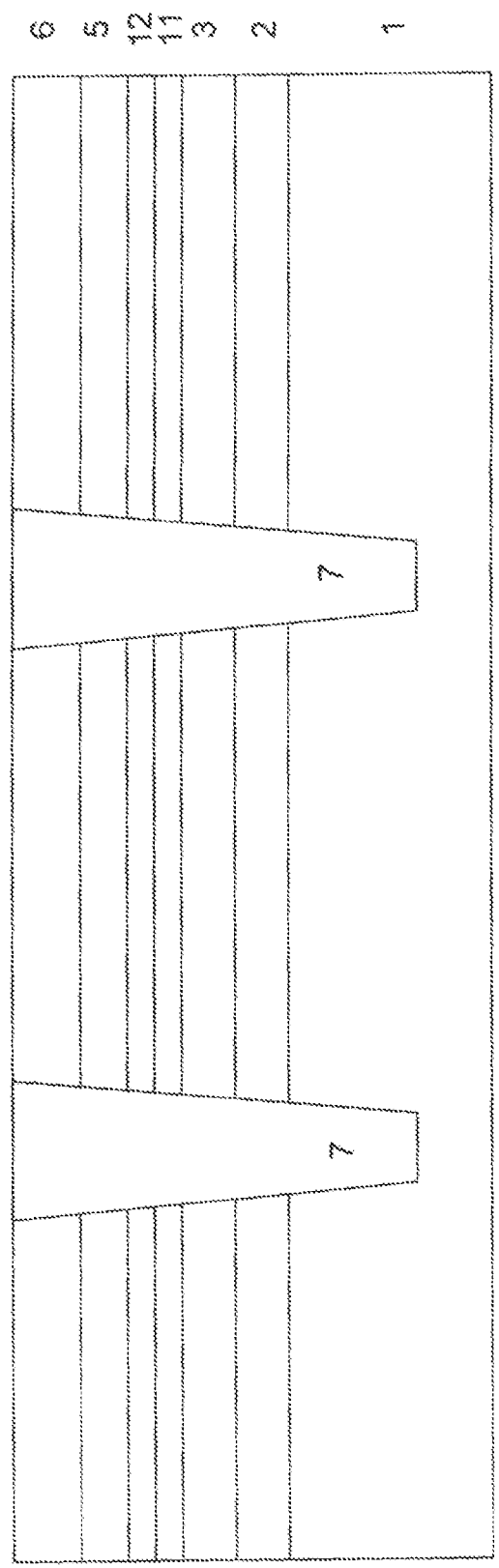

FIGS. 4a to 4c illustrate an example for the method for manufacturing a semiconductor device according to the present invention, wherein a floating-gate FET that comprises a part of a BOX layer of an SOI structure as a tunnel dielectric and SOI transistors are formed.

The starting point for this exemplary inventive method is the stack shown in FIG. 1a. A dielectric layer 11 is grown or deposited on crystal silicon layer 3 and a polysilicon layer 12 is formed on the dielectric layer 11 (see FIG. 4a). The thin polysilicon layer 12 serves as a protection layer for the dielectric layer 11 during the further processing. Subsequently, a dielectric layer 5 is formed on the polysilicon layer 12 and a nitride layer 6 is deposited on the dielectric layer 5. Shallow trench isolation regions are defined by lithography and trenches are etched through layers 2, 3, 11, 12, 5 and 6 and extending to the polysilicon substrate 1 and filled with some dielectric material to obtain shallow trench isolations 7. Layers 5 and 6 function as a hard mask during the process of etching the trenches. The dielectric material filled into the trenches is planarized with the nitride layer 6. The thus resulting structure is illustrated in FIG. 4b.

Further processing similar to the one described with reference to FIG. 1c to 1g results in the structure shown in FIG. 4c. MOSFETs 20 are formed in the left and right regions of FIG. 4c that are separated from the central region by shallow trench isolations 7. However, a floating-gate FET 30 comprising a floating gate 3' above a tunnel dielectric 2 wherein the floating gate 3' is separated from a gate electrode 10' by a gate dielectric 11' and thin polysilicon layer 12' is formed in the central region.

Whereas in the description of the Figures processing of an SOI structure is described a semiconductor-on-insulator structure in general can be processed according to the described inventive methods. For example, germanium, silicon-germanium, strained silicon, strained silicon-germanium, etc. can be used rather than conventional silicon in the semiconductor-on-insulator structure.

All previously discussed embodiments are not intended as limitations but serve as examples illustrating features and advantages of the invention. It is to be understood that some or all of the above described features can also be combined in different ways.

What is claimed is:

1. A semiconductor device, comprising
a semiconductor-on-insulator (SeOI) structure, comprising:
   a substrate;
   an insulating layer on the substrate; and
   a semiconductor layer on the insulating layer, wherein a first field-effect-transistor (FET) is formed therein, and further wherein the first FET comprises;
   a channel region in the substrate;
   a dielectric layer formed at least partially from a part of the insulating layer of the semiconductor-on-insulator structure; and
   a gate formed at least partially from a first part of the semiconductor layer of the semiconductor-on-insulator structure; and
a second FET formed in the semiconductor-on-insulator structure, the structure comprising a channel region and source and drain regions made of a second part of the semiconductor layer of the semiconductor-on-insulator structure;

wherein the first part of the semiconductor layer of the SeOI structure and the second part of the semiconductor layer of the SeOI structure at least partially overlap each other.

2. The semiconductor device according to claim 1, wherein the semiconductor-on-insulator structure is a silicon-on-insulator (SOI) structure, wherein the semiconductor layer is a single crystal silicon layer and the insulating layer is an oxide.

3. The semiconductor device according to claim 1, wherein the insulating layer is an oxide that forms a buried oxide (BOX) layer in the semiconductor-on-insulator structure.

4. The semiconductor device according to claim 1, wherein the dielectric layer forms a gate dielectric of the FET, and the gate is a gate electrode that is further comprised of a layer of polysilicon on the first part of the semiconductor layer of the semiconductor-on-insulator structure.

5. The semiconductor device according to claim 1, wherein the first part of the semiconductor layer of the SeOI structure forms at least partially a source or drain region of the other FET.

6. The semiconductor device according to claim 1, which further comprises forming an additional FET comprising a channel region and source and drain regions from a third part of the semiconductor layer of the semiconductor-on-insulator structure.

7. The semiconductor device according to claim 6, wherein the first part of the semiconductor layer of the semiconductor-on-insulator structure is different from the third part of the semiconductor layer of the semiconductor-on-insulator structure; and further comprising:
an insulator region, wherein the insulator region is a shallow trench isolation feature separating the FET comprising the dielectric that is made from a part of the insulating layer of the semiconductor-on-insulator structure from the additional FET.

8. The semiconductor device of claim 7, wherein the insulator region is a shallow trench isolation feature separating the FET made from part of the third part of the semiconductor layer from the FET made from the first part of the semiconductor layer.

9. A method for manufacturing a field effect transistor (FET) in a semiconductor device according to claim 1, which comprises:
forming the first FET by providing a semiconductor-on-insulator (SeOI) structure which comprises:
a substrate;
an insulating layer on the substrate; and
a semiconductor layer on the insulating layer; and
forming a polysilicon layer on the semiconductor layer to obtain a polysilicon on SeOI structure; and
etching the polysilicon on SeOI structure to form a FET comprising;
a channel region in the substrate;
a gate dielectric made from a first part of the insulating layer of the SeOI structure; and
a gate electrode at least partially made of a first part of the semiconductor layer of the SeOI structure and a part of the polysilicon layer formed on the semiconductor layer.

10. The method according to claim 9, which further comprises introducing dopants into the SeOI structure to create the channel region and a source and a drain region in the substrate.

11. The method according to claim 10, which further comprises manufacturing a floating gate FET and a MOSFET on the SeOI structure by:

forming a gate dielectric on the semiconductor layer of the SeOI structure;
forming a gate electrode on a first part of the gate dielectric, wherein at least a part of the semiconductor layer is a floating gate;
forming source and drain regions in the semiconductor layer, such that either one of the source or drain regions is at least partly formed of at least a part of the floating gate that is at least a part of the first part of the semiconductor layer of the SeOI structure;
forming a metal layer on a second part of the gate dielectric;
forming a polysilicon layer on the metal layer; and
etching the metal layer and polysilicon layer to form a MOSFET gate electrode on the second part of the gate dielectric.

12. The method according to claim 9, which further comprises:
manufacturing a MOSFET on the SeOI structure by:
forming a gate dielectric on the semiconductor layer of the SeOI structure, wherein the semiconductor layer is a single crystal silicon layer;
forming a gate electrode on the gate dielectric; and
forming source and drain regions such that one of the source and drain regions is at least partly formed of at least a part of the gate electrode that is at least partially made of the first part of the single crystal silicon layer of the SeOI structure
forming a metal layer on a second part of the gate dielectric;
forming a polysilicon layer on the metal layer; and
etching the metal layer and polysilicon layer to form a MOSFET gate electrode on the second part of the gate dielectric.

13. The method according to claim 9, which further comprises manufacturing a metal-oxide-semiconductor (MOSFET) in addition to a FET, by:
forming a mask layer on the SeOI structure;
forming a shallow trench isolation through the mask layer extending to the substrate and separating a first region of the SeOI structure from a second region of the SeOI structure;
removing the mask layer from the second region of the SeOI structure;
subsequently forming a dielectric layer on the second region of the SeOI structure;
forming a metal layer on the dielectric layer;
etching the metal layer, the dielectric layer and the SeOI structure in the second region to form a MOSFET in the second region of the SeOI structure; and
removing the mask layer from the first region of the SeOI structure;
wherein the polysilicon layer is formed on the semiconductor layer in the first region of the SeOI structure after removing the mask layer to obtain the polysilicon layer on SeOI structure and on the metal layer in the second region.

14. The method according to claim 9, wherein the providing of the SeOI structure comprises:
providing an silicon-on-insulator (SOI) stack comprising;
a substrate layer;
a first insulating layer on the substrate layer; and
a single crystal silicon layer on the first insulating layer;
forming an oxide layer on the single crystal silicon layer;
forming a mask layer on the oxide layer; and patterning the oxide layer and the mask layer to form a structure wherein a first part of the single crystal silicon layer is exposed.

15. The method according to claim 14, which further comprises:
thermally oxidizing the structure and exposed single crystal silicon layer to form a silicon oxide layer on the previously exposed single crystal silicon layer and a first thinned single crystal silicon layer; and
removing the oxide layer and the mask layer and the silicon oxide layer formed on the previously exposed single crystal silicon layer;
wherein the first part of the single crystal silicon layer of the SOI structure is at least a part of the first thinned single crystal silicon layer.

16. The method according to claim 14, wherein the first insulating layer of the silicon-on-insulator (SOI) stack is a silicon dioxide layer, and which further comprises:
subjecting the structure and exposed single crystal silicon layer to an anneal process thereby partially dissolving the part of the silicon dioxide layer beneath the exposed first part of the single crystal silicon layer in order to obtain a thinned silicon dioxide layer; and
removing the second oxide layer on the single crystal silicon layer and the mask layer on the second oxide layer; and
wherein the part of the oxide layer of the SOI structure is at least a part of the thinned silicon dioxide layer.

17. The method of claim 16, wherein the semiconductor-on-insulator (SeOI) structure is a silicon-on-insulator (SOI) structure, further wherein the semiconductor layer is a single crystal silicon layer.

18. A semiconductor device comprising:
a semiconductor-on-insulator (SeOI) structure comprising:
a substrate;
an insulating layer on the substrate; and
a semiconductor layer on the insulating layer, wherein a field-effect-transistor (FET) is formed therein as a floating gate FET, and further wherein the FET comprises;
a channel region in the substrate;
a dielectric layer formed at least partially from a part of the insulating layer of the semiconductor-on-insulator structure;
a gate formed at least partially from a first part of the semiconductor layer of the semiconductor-on-insulator structure;
a tunnel dielectric formed at least partially from the insulating layer;
a floating gate above the tunnel dielectric and formed at least partially from the semiconductor layer;
a gate dielectric layer above the floating gate; and
a gate electrode formed above the gate dielectric, wherein the floating gate is separated from the gate electrode by the gate dielectric and from the channel region in the substrate by the tunnel dielectric.

19. A method for manufacturing a floating gate field effect transistor in a semiconductor device according to claim 18, which comprises:
providing a semiconductor-on-insulator (SeOI) structure comprising:
a substrate;
an insulating layer on the substrate; and
a semiconductor layer on the insulating layer;
forming a dielectric layer on the semiconductor layer;
forming a polysilicon layer on the dielectric layer to obtain a multilayer structure; and
etching the multilayer structure to form a floating-gate FET comprising:
a channel region in the substrate;
a tunnel dielectric made from a part of the insulating layer of the SeOI structure;
a floating gate made of a first part of the semiconductor layer of the SeOI structure;
a gate dielectric made of a part of the dielectric layer formed on the semiconductor layer; and
a gate electrode comprising a part of the polysilicon layer formed on the dielectric layer.

20. The method according to claim 19, which further comprises:
forming a mask layer on the SeOI structure;
forming a shallow trench isolation through the mask layer extending to the substrate and separating a first region of the SeOI structure from a second region of the SeOI structure;
removing the mask layer from the second region of the SeOI structure;
subsequently forming a second dielectric layer on the second region of the SeOI structure;
forming a metal layer on the second dielectric layer;
removing the mask layer from the first region of the SeOI structure; and
etching the metal layer, the second dielectric layer and the SeOI structure in the second region to form the MOSFET in the second region of the SeOI structure; and
wherein the dielectric layer is formed on the semiconductor layer and the polysilicon layer is formed on the dielectric layer to obtain a multilayer structure in the first region of the SeOI structure.

* * * * *